United States Patent
Jeong et al.

(10) Patent No.: US 11,217,772 B2
(45) Date of Patent: Jan. 4, 2022

(54) THIN FILM ENCAPSULATION STRUCTURE FOR DISPLAY APPARATUS

(71) Applicant: SAMSUNG DISPLAY CO., LTD., Yongin-si (KR)

(72) Inventors: Soyeon Jeong, Yongin-si (KR); Jaehyun Kim, Yongin-si (KR); Daesang Yun, Yongin-si (KR); Cheho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 59 days.

(21) Appl. No.: 16/519,248

(22) Filed: Jul. 23, 2019

(65) Prior Publication Data
US 2020/0106050 A1 Apr. 2, 2020

(30) Foreign Application Priority Data
Oct. 1, 2018 (KR) .......................... 10-2018-0116716

(51) Int. Cl.
*H01L 51/52* (2006.01)
*G06F 3/044* (2006.01)
*H01L 27/32* (2006.01)

(52) U.S. Cl.
CPC .......... *H01L 51/5256* (2013.01); *G06F 3/044* (2013.01); *H01L 27/323* (2013.01);
(Continued)

(58) Field of Classification Search
CPC ............ H01L 51/5265; H01L 51/5253; H01L 51/5275; H01L 51/5012; H01L 51/5206;
(Continued)

(56) References Cited

U.S. PATENT DOCUMENTS

| 9,583,732 B2 | 2/2017 | Lee et al. |
| 10,181,584 B2 | 1/2019 | Lee et al. |

(Continued)

FOREIGN PATENT DOCUMENTS

| EP | 2950363 A1 | 12/2015 |
| EP | 3301550 A1 | 4/2018 |

(Continued)

OTHER PUBLICATIONS

EPO Extended Search Report dated Feb. 17, 2020, for corresponding European Patent Application No. 19200829.0 (10 pages).

*Primary Examiner* — Lex H Malsawma
*Assistant Examiner* — Gardner W. S. Swan
(74) *Attorney, Agent, or Firm* — Lewis Roca Rothgerber Christie LLP

(57) ABSTRACT

A display apparatus including a base layer including a display region and a non-display region; display elements on the display region and including a first electrode, a light emitting layer, and a second electrode on the light emitting layer; and an upper layer on the display elements, wherein the upper layer includes a first organic layer contacting the second electrode; a first inorganic layer contacting the first organic layer; a second organic layer contacting the first inorganic layer; and a second inorganic layer contacting the second organic layer, wherein the first inorganic layer includes a first and second area, the first area having a refractive index of about 1.60 to about 1.65 with respect to a wavelength of about 633 nm, wherein the first area has a uniform thickness, and wherein a thickness of the second area decreases as a distance from the display region increases.

16 Claims, 18 Drawing Sheets

(52) U.S. Cl.
CPC ...... *H01L 51/5265* (2013.01); *H01L 27/3244* (2013.01); *H01L 2251/5315* (2013.01); *H01L 2251/558* (2013.01)

(58) Field of Classification Search
CPC ............. H01L 51/5221; H01L 27/3244; H01L 2251/301; H01L 2251/558
USPC .......................................................... 257/91
See application file for complete search history.

(56) References Cited

U.S. PATENT DOCUMENTS

| | | | |
|---|---|---|---|
| 2004/0156104 A1* | 8/2004 | Hayashi | ............... G02B 5/3033 |
| | | | 359/487.02 |
| 2014/0070187 A1 | 3/2014 | Cho et al. | |
| 2014/0103309 A1 | 4/2014 | Cho et al. | |
| 2016/0197308 A1 | 7/2016 | Jeong | |
| 2016/0276624 A1* | 9/2016 | Wang | ................. H01L 51/5253 |
| 2018/0019439 A1* | 1/2018 | Lee | ..................... H01L 51/5253 |
| 2018/0083227 A1 | 3/2018 | Ju et al. | |
| 2018/0095571 A1 | 4/2018 | Park et al. | |
| 2018/0226610 A1 | 8/2018 | Moon et al. | |
| 2019/0220123 A1* | 7/2019 | Kanaya | ................. G06F 3/0443 |

FOREIGN PATENT DOCUMENTS

| | | |
|---|---|---|
| JP | 2012-004063 A | 1/2012 |
| JP | 2012-151060 A | 8/2012 |
| KR | 10-2016-0083986 A | 7/2016 |
| KR | 10-2017-0092737 A | 8/2017 |

\* cited by examiner

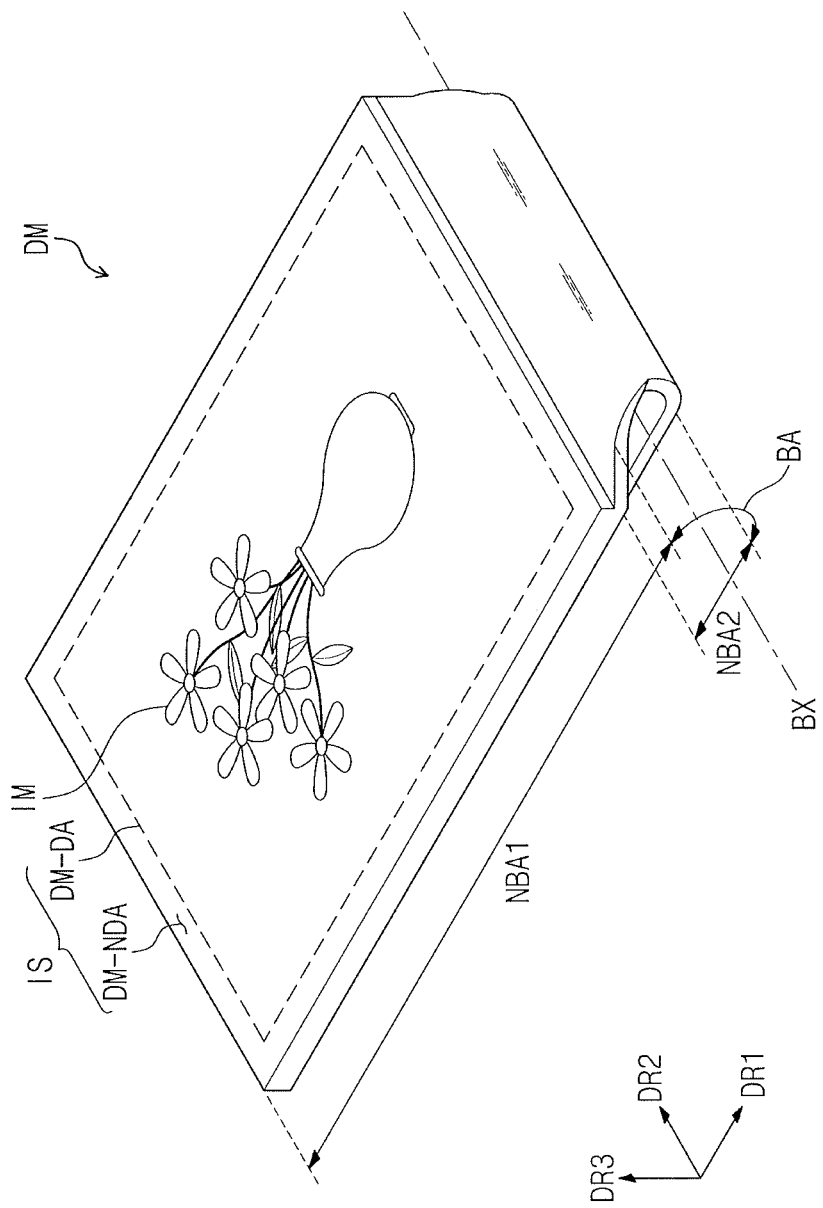

THIN FILM ENCAPSULATION STRUCTURE FOR DISPLAY APPARATUS

CROSS-REFERENCE TO RELATED APPLICATION

Korean Patent Application No. 10-2018-0116716, filed on Oct. 1, 2018, in the Korean Intellectual Property Office, and entitled: "Display Module," is incorporated by reference herein in its entirety.

BACKGROUND

1. Field

Embodiments relate to a display apparatus.

2. Description of the Related Art

A display device is a device which displays an image and recently, an organic light emitting diode (OLED) display has attracted attention.

An organic light emitting diode display has self-luminescence properties, and unlike a liquid crystal display device, a separate light source is not required, so that the thickness and weight thereof may be reduced. In addition, an organic light emitting display device exhibits high-quality properties such as low power consumption, high luminance, and high reaction time.

SUMMARY

The embodiments may be realized by providing a display apparatus including a base layer including a display region and a non-display region outside of the display region; display elements on the display region, each of the display elements including a first electrode, a light emitting layer on the first electrode, and a second electrode on the light emitting layer; and an upper layer on the display elements, wherein the upper layer includes a first organic layer on the second electrode and contacting the second electrode; a first inorganic layer on the first organic layer and contacting the first organic layer; a second organic layer on the first inorganic layer and contacting the first inorganic layer; and a second inorganic layer on the second organic layer and contacting the second organic layer, wherein the first inorganic layer includes a first area and a second area extending from the first area, the first area having a refractive index of about 1.60 to about 1.65 with respect to a wavelength of about 633 nm, wherein the first area has a uniform thickness, and wherein a thickness of the second area decreases as a distance from the display region increases.

The first organic layer has a higher reflective index than the first inorganic layer.

The reflective index of the first organic layer is about 1.8 to about 1.9.

The first inorganic layer includes silicon oxynitride.

The first inorganic layer is one of silicon oxynitride layer, silicon oxide layer, and silicon nitride layer.

A thickness of the first organic layer is about 5% to about 10% of the thickness of the first area of the first inorganic layer.

A thickness of the first organic layer is about 500 Å to about 900 Å, and the thickness of the first area of the first inorganic layer is about 1,000 Å to about 11,000 Å.

A thickness of a region, overlapping the display region, in the second area is about 9,500 Å to about 10,500 Å.

The second organic layer includes an acryl monomer, and a thickness of the second organic layer is about 3 μm to about 12 μm.

The second electrode of the display elements has an integral shape, and an edge of the second electrode and an edge of the first organic layer are aligned in a plan view.

The second inorganic layer includes silicon nitride.

The second inorganic layer has a refractive index of about 1.7 to about 2.0, and a thickness of about 4,500 Å to about 8,000 Å.

The display apparatus further includes a third inorganic layer on the second inorganic layer and contacting the second inorganic layer.

The display apparatus further includes a first touch insulation layer on the second inorganic layer and contacting the second inorganic layer; a first conductive pattern on the first touch insulation layer; a second touch insulation layer on the first touch insulation layer and covering the first conductive pattern; a second conductive pattern on the second touch insulation layer and connected to the first conductive pattern via a contact hole passing through the second touch insulation layer; and a third touch insulation layer on the second touch insulation layer and covering the second conductive pattern.

The first touch insulation layer and the second touch insulation layer each include an inorganic material, and the third touch insulation layer includes an organic material.

The embodiments may be realized by providing a display apparatus including a base layer including a display region and a non-display region outside the display region; an insulation dam pattern on the non-display region and surrounding the display region; display elements on the display region, each of the display elements including a first electrode, a light emitting layer on the first electrode, and a second electrode on the light emitting layer; and an upper layer on the display elements, wherein the upper layer includes a first organic layer on the second electrode and contacting the second electrode; a first inorganic layer on the first organic layer and contacting the first organic layer; a second organic layer on the first inorganic layer and contacting the first inorganic layer; and a second inorganic layer on the second organic layer and contacting the second organic layer, and wherein the second electrode of the display elements has an integral shape, an edge of the second electrode and an edge of the first organic layer are aligned in a plan view, and an edge of the first inorganic layer is outside the edge of the second electrode and the edge of the first organic layer.

The edge of the second electrode and the edge of the first organic layer are inside of the insulation dam pattern in a plan view, and the edge of the first inorganic layer is outside the insulation dam pattern in a plan view.

The first inorganic layer has a uniform thickness and includes a first area having a refractive index of about 1.60 to about 1.65 with respect to a wavelength of about 633 nm, and a second area extending from the first area and having a decreasing thickness with increasing distance from the display region.

The embodiments may be realized by providing a display apparatus including a base layer including a display region and a non-display region outside the display region; display elements on the display region, each of the display elements including a first electrode, a light emitting layer on the first electrode, and a second electrode on the light emitting layer; and an upper layer on the display elements, wherein the upper layer includes an organic layer on the second electrode, the organic layer contacting the second electrode and having a refractive index of about 1.8 to about 1.9 with respect to a wavelength of about 633 nm; and a silicon oxynitride layer on the organic layer and contacting the organic layer, wherein the silicon oxynitride layer includes a first area and a second area extending from the first area, the first area having a refractive index of about 1.61 to about 1.63 with respect to the wavelength of about 633 nm, wherein the first area has a uniform thickness, and wherein a thickness of the second area decreases as a distance from the display region increases.

The second electrode of each of the display elements has an integral shape, an edge of the second electrode and an edge of the organic layer are aligned in a plan view, and an edge of the silicon oxynitride layer is outside the edge of the second electrode and the edge of the organic layer.

BRIEF DESCRIPTION OF THE DRAWINGS

Features will be apparent to those of skill in the art by describing in detail exemplary embodiments with reference to the attached drawings in which:

FIG. 1A and FIG. 1B illustrate perspective views of a display apparatus according to an embodiment;

DETAILED DESCRIPTION

Figure 1A:
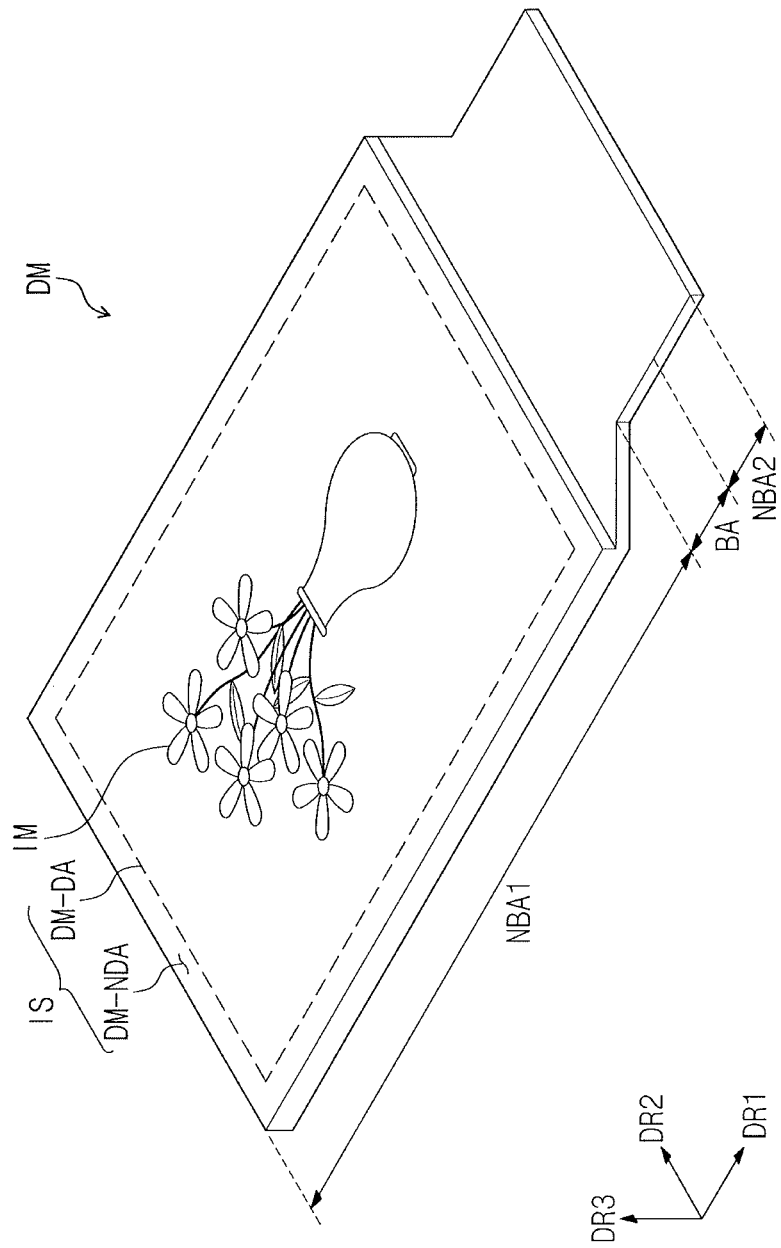

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In the present specification, when an element (or a region, a layer, a portion, etc.) is referred to as being, e.g., "on," "connected to," or "coupled to" another element, it means that the element may be directly on/connected to/coupled to the other element, or that a third element may be therebetween.

Also, in the drawings, the thickness, the ratio, and the dimensions of elements are exaggerated for an effective description of technical contents. The terms "or" and "and/or," include all combinations of one or more of which associated configurations may define.

Although terms "first", "second," and the like may be used herein to describe various elements, the elements should not be limited by the terms. The terms are only used to distinguish one element from another. For example, a first element could be termed a second element, and similarly, a second element could be termed a first element, without departing from the scope of the embodiments. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that terms "include," "comprise," "have," and the like are intended to specify the presence of stated features, integers, steps, operations, elements, components, or combinations thereof in the specification, but do not preclude the presence or addition of one or more other features, integers, steps, operations, elements, components, or combinations thereof.

Figure 2:
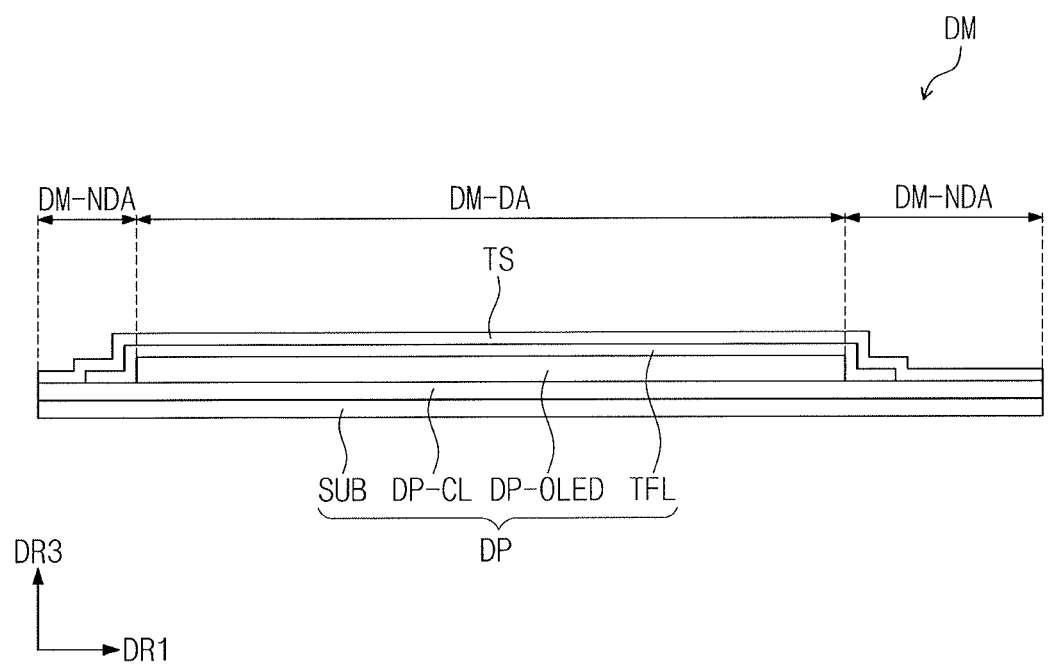
FIG. 2 illustrates a cross-sectional view of a display apparatus according to an embodiment.

FIG. 1A and FIG. 1B illustrate perspective views of a display apparatus DM according to an embodiment. FIG. 2 illustrates a cross-sectional view of the display apparatus DM according to an embodiment.

As shown in FIG. 1A and FIG. 1B, a display surface IS on which an image IM is displayed may be parallel to a surface defined by a first direction axis DR1 and a second direction axis DR2. A normal direction of the display surface IS, e.g., the thickness direction of the display apparatus DM is indicated by a third direction axis DR3. A front surface (or an upper surface) and a rear surface (or a lower surface) of each member are divided by the third direction axis DR3. However, directions indicated by the first to third direction axes DR1, DR2, and DR3 are a relative concept, and therefore, may be converted to other directions. Hereinafter, a first to third directions are the directions each indicated by the first to third direction axes DR1, DR2, and DR3, and refer to the same reference numerals.

In an implementation, the display apparatus DM according to the embodiment may be a flexible display apparatus. In an implementation, the display apparatus may be a flat rigid display apparatus DM. The display apparatus DM according to an embodiment may be applied for a large-sized electronic device, such as a TV set, a monitor, and the like, or for a small and medium-sized electronic device, such as a cellphone, a tablet PC, a global positioning system (GPS), a game console, a smart watch, and the like.

As shown in FIG. 1A and FIG. 1B, the display apparatus DM may include a display area DM-DA on which the image IM is displayed, and a non-display area DM-NDA which is adjacent to the display area DM-DA. The non-display area DM-NDA may be an area on which the image IM is not displayed. For example, the image IM or the display area DM-DA may have a square or rectangular shape. The non-display area DM-NDA may surround the display area DM-DA. In an implementation, the shape of the display area DM-DA and the shape of the non-display area DM-NDA may be relatively designed.

According to the embodiment, some regions of the display apparatus DM may be bent.

The display apparatus DM may include a first non-bending area NBA1, a second non-bending area NBA2 spaced apart from the first non-bending area NBA1 in the first direction DR1, and a bending area BA between the first non-bending area NBA1 and the second non-bending area NBA2. The display area DM-DA may be included in the first non-bending area NBA1. Some portions of the non-display area DM-NDA each correspond to the second non-bending area NBA2 and the bending area BA, and some other portions of the non-display area DM-NDA adjacent to the display area DM-DA may be included in the first non-bending area NBA1.

The bending area BA may be bent along or about a bending axis BX defined in the second direction DR2. The second non-bending area NBA2 and the first non-bending area NBA1 may face each other. The bending area BA and the second non-bending area NBA2 may have a width in the second direction DR2 that is smaller than that of the first non-bending area NBA1.

FIG. 2 illustrates a cross-sectional view of the display apparatus DM according to an embodiment. FIG. 2 shows a cross section defined by the first direction axis DR1 and the third direction axis DR3.

As shown in FIG. 2, the display apparatus DM may include a display panel DP and an input sensing unit TS (or a touch sensing unit). In an implementation, the display apparatus DM according to an embodiment may further include a protection member on a lower surface of the display panel DP, an antireflection member and/or a window member on an upper surface of the input sensing unit TS.

In an implementation, the display panel DP may be a light emitting type display panel. In an implementation, the display panel DP may be an organic light emitting display panel or a quantum dot light emitting display panel. In an organic light emitting display panel, a light emitting layer includes an organic light emitting material. In a quantum dot light emitting display panel, a light emitting layer includes a quantum dot, and a quantum rod. Hereinafter, the display panel DP is described as an organic light emitting display panel.

The display panel DP may include a base layer SUB, a circuit element layer DP-CL on the base layer SUB, a display element layer DP-OLED, and an upper layer TFL. The input sensing unit TS may be directly on the upper layer TFL. In the present disclosure, when "A configuration is directly on B configuration", it means that no adhesive layer is between the A configuration and the B configuration.

The base layer SUB may include at least one plastic film. The base layer SUB may be a flexible substrate, and may include a plastic substrate, a glass substrate, a metal substrate, or an organic/inorganic composite material substrate. The display area DM-DA and the non-display area DM-NDA described with reference to FIG. 1A and FIG. 1B may be defined the same for the base layer SUB.

The circuit element layer DP-CL may include at least one intermediate insulation layer and a circuit element. The intermediate insulation layer may include at least one intermediate inorganic film and at least one intermediate organic film. The circuit element may include signal lines, a driving circuit of a pixel, and the like. A detailed description thereof will be given below.

The display element layer DP-OLED may include organic light emitting diodes. The display element layer DP-OLED may further include an organic film such as a pixel defining film.

The upper layer TFL may include a plurality of thin films. Some thin films may help improve optical efficiency, and some other thin films may help protect organic light emitting diodes. A detailed description of the upper layer TFL will be given below.

The input sensing unit TS may obtain coordinate information of an external input. The input sensing unit TS may have a multi-layered structure. The input sensing unit TS may include a conductive layer of a single layer or of multiple layers. The input sensing unit TS may include an insulation layer of a single layer or of multiple layers.

In an implementation, the input sensing unit TS may sense an external input, e.g., by a capacitive method. In an implementation, the input sensing unit TS may sense an external input by an electromagnetic induction method or a pressure sensing method.

In an implementation, the input sensing unit TS may be omitted. In an implementation, the input sensing unit TS may be separately manufactured and attached to the display panel DP by an adhesive layer.

Figure 3:
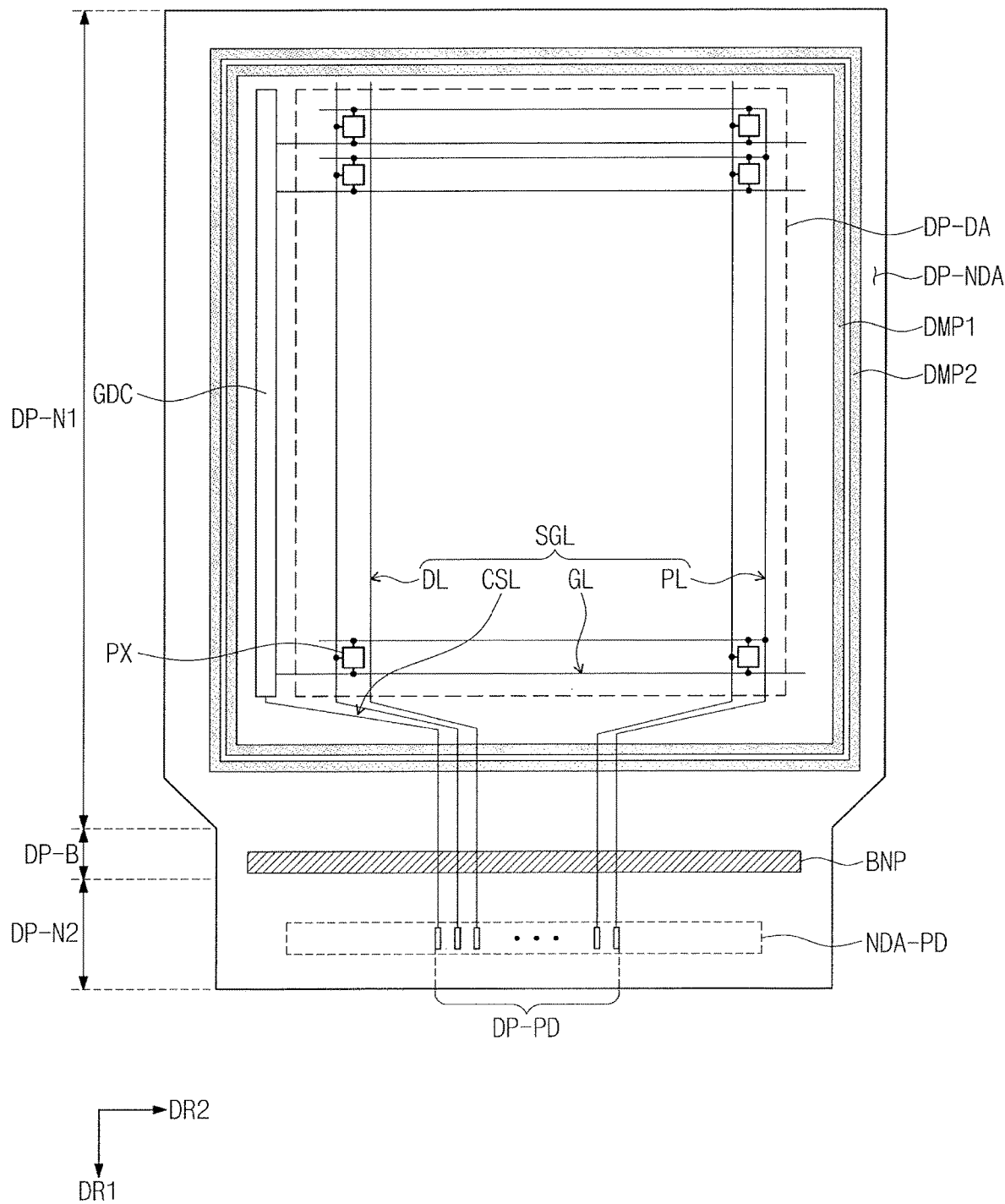
FIG. 3 illustrates a plan view of a display panel according to an embodiment.
Figure 4:
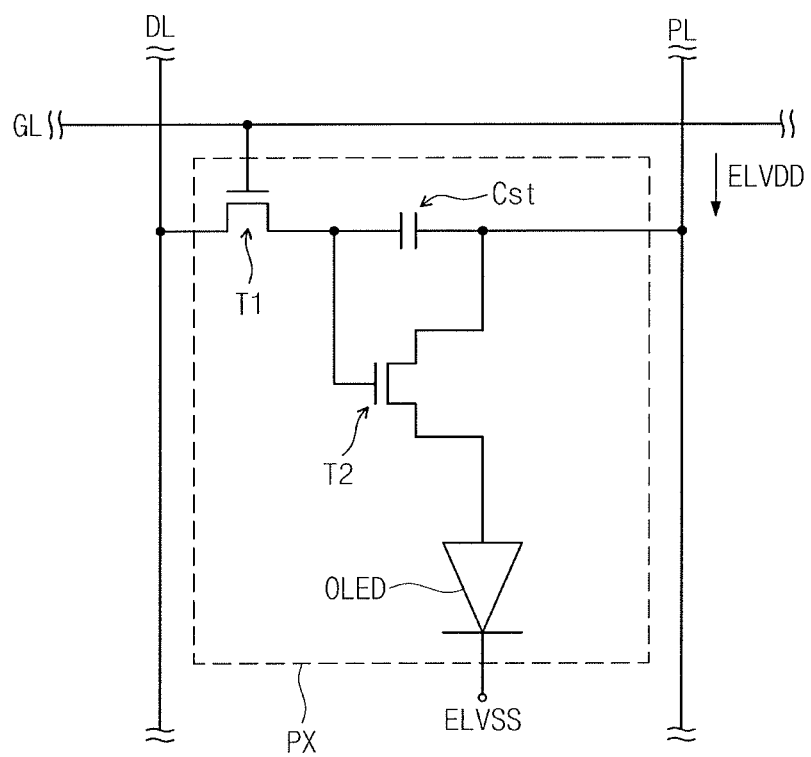
FIG. 4 illustrates an equivalent circuit diagram of a pixel panel according to an embodiment.
Figure 5A:
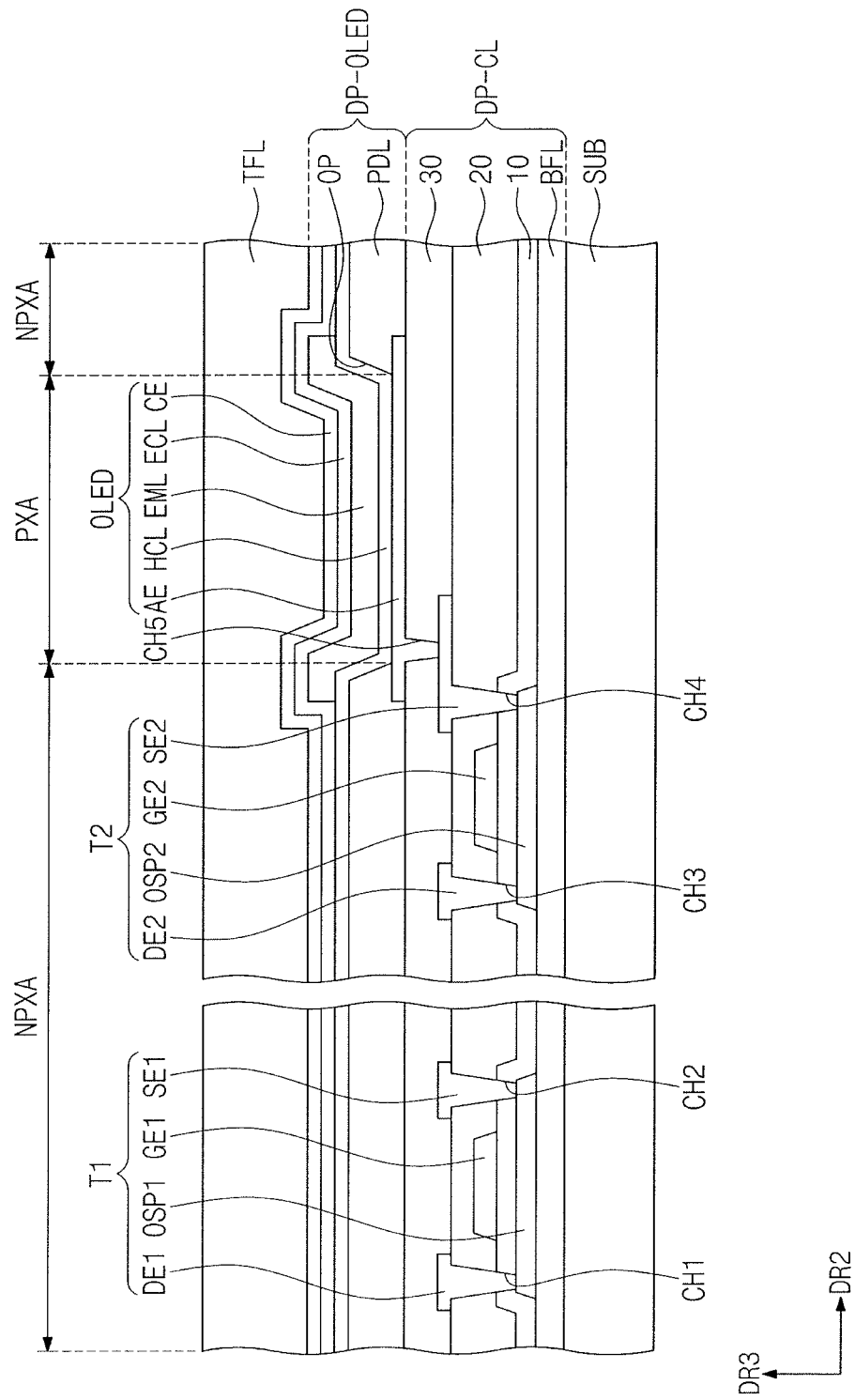
FIG. 5A illustrates an enlarged cross-sectional view of a display panel according to an embodiment.
Figure 5B:
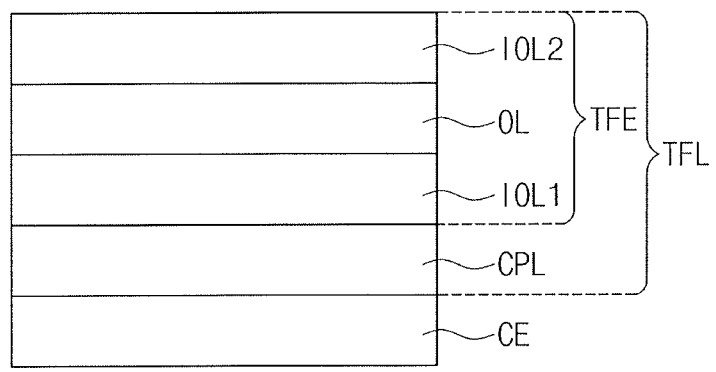
FIG. 5B illustrates an enlarged cross-sectional view of an upper layer according to an embodiment.

FIG. 3 illustrates a plan view of the display panel DP according to an embodiment. FIG. 4 illustrates an equivalent circuit diagram of a pixel PX according to an embodiment. FIG. 5A illustrates an enlarged cross-sectional view of the display panel DP according to an embodiment. FIG. 5B illustrates an enlarged cross-sectional view of the upper layer TFL according to an embodiment.

As shown in FIG. 3, the display panel DP may include a display area DP-DA and a non-display area DP-NDA in a plan view. In an implementation, the non-display area DP-NDA may be defined along the edge of the display area DP-DA. The display area DP-DA and the non-display area DP-NDA of the display panel DP each correspond to the display area DM-DA and the non-display area DM-NDA of the display apparatus DM shown in FIG. 1A and FIG. 1B.

The display panel DP may include a first non-bending area DP-N1, a second non-bending area DP-N2, and a bending area DP-B that respectively corresponds to the first non-bending area NBA1, the second non-bending area NBA2, and the bending area BA shown in FIG. 1A and FIG. 1B. Corresponding areas of the display panel DP and the display apparatus DM may not necessarily have to be the same, and may be changed according to the structure/design of the display panel DP.

The display panel DP may include a driving circuit GDC, a plurality of signal lines SGL, and a plurality of pixels PX. The plurality of pixels PX may be in the display region DP-DA. Each of the pixels PX may include an organic light emitting diode and a pixel driving circuit connected thereto. The driving circuit GDC, the plurality of signal lines SGL, and the pixel driving circuit may be included in the circuit element layer DP-CL shown in FIG. 2.

The driving circuit GDC may include a scan driving circuit. The scan driving circuit GDC may generate a plurality of scan signals, and may output the plurality of scan signals sequentially to a plurality of scan lines GL to be described later. The scan driving circuit GDC may further output another control signal to the driving circuit of the pixels PX.

The scan driving circuit GDC may include a plurality of thin film transistors formed through the same process as the driving circuit of the pixels PX, e.g., a Low Temperature Polycrystaline Silicon (LIPS) process, or a Low Temperature Polycrystalline Oxide (LTPO) process.

The plurality of signal lines SGL may include gate lines GL, data lines DL, a power line PL, and a control signal line CSL. Each of the scan lines GL may be connected to a corresponding pixel among the plurality of pixels PX, and each of the data lines DL may be connected to a corresponding pixel among the plurality of pixels PX. The power line PL may be connected to the plurality of pixels PX. The control signal line CSL may provide control signals to the scan driving circuit GDC.

The display panel DP may include signal pads DP-PD connected to the ends of the signal lines SGL. The signal pads may each be a kind of circuit element. A region in the non-display area DP-NDA, the region on which the signal pads DP-PD are disposed, may be defined as a pad area NDA-PD.

The display panel DP may include insulation dam patterns DMP1 and DMP2. FIG. 3 exemplarily shows two insulation dam patterns DMP1 and DMP2. The two insulation dam patterns DMP1 and DMP2 may be in the non-display area DP-NDA and may surround the display area DP-DA. A portion of the two insulation dam patterns DMP1 and DMP2 may be parallel to the pad area NDA-PD.

The display panel DP may include a bank BNP. The bank BNP may be between the display area DP-DA and the pad area NDA-PD. The bank BNP may be parallel to the portion of the insulation dam patterns DMP1 and DMP2 and the pad area NDA-PD. In an implementation, at least one of the insulation dam patterns DMP1 and DMP2 and the bank BNP may be omitted.

FIG. 4 exemplarily shows the pixel PX connected to one scan line GL, one data line DL, and the power line PL.

An organic light emitting diode OLED may be a front emission type light emitting diode, or a bottom emission type light emitting diode. The organic light emitting diode OLED may include at least two electrodes and an organic light emitting layer disposed therebetween. The pixel PX may include a first transistor T1 (or a switching transistor), a second transistor T2 (or a driving transistor), and a capacitor Cst as a pixel driving circuit for driving the organic light emitting diode OLED. A first power voltage ELVDD may be provided to the second transistor T2, and a second power voltage ELVSS may be provided to the organic light emitting diode OLED. The second power voltage ELVSS may be a voltage lower than the first power voltage ELVDD.

The first transistor T1 may output a data signal applied to the data line DL in response to a scan signal applied to the gate line GL. The capacitor Cst may charge a voltage corresponding to the data signal received from the first transistor T1.

The second transistor T2 may be connected to the organic light emitting diode OLED. The second transistor T2 may control a driving current flowing in the organic light emitting diode OLED in accordance with the amount of charge stored in the capacitor Cst. The organic light emitting diode OLED may emit light during the turn-on period of the second transistor T2.

FIG. 5A illustrates a partial cross-sectional view of the display panel DP corresponding to the equivalent circuit shown in FIG. 4. The circuit element layer DP-CL, the display element layer DP-OLED, and the upper layer TFL may be sequentially on the base layer SUB.

The circuit element layer DP-CL may include at least one insulation layer and a circuit element. The circuit element may include a signal line and a driving circuit of a pixel, and the like. The circuit element layer DP-CL may be formed through a forming process of an insulating layer, a semiconductor layer, and a conductive layer by coating, deposition, and the like, and a patterning process of an insulating layer, a semiconductor layer, and a conductive layer by a photolithography process.

In an implementation, the circuit element layer DP-CL may include a buffer film BFL which is an inorganic film, a first intermediate inorganic film 10, and a second intermediate inorganic film 20, and may include an intermediate organic film 30 which is an organic film. The buffer film BFL may include a plurality of inorganic films laminated. FIG. 5A exemplarily shows the arrangement relationship of a first semiconductor pattern OSP1, a second semiconductor pattern OSP2, a first control electrode GE1, a second control electrode GE2, a first input electrode DE1, a first output electrode SE1, a second input electrode DE2, a second output electrode SE2 all constituting the switching transistor T1 and the driving transistor T2. First to fourth through-hole CH1 to CH4 are also exemplarily shown.

The display element layer DP-OLED may include the organic light emitting diode OLED. The display element layer DP-OLED may include a pixel definition film PDL. For example, the pixel definition film PDL may be an organic layer.

On the intermediate organic film 30, a first electrode AE may be disposed. The first electrode AE may be connected to the second output electrode SE2 through a fifth through-hole CH5 passing through the intermediate organic film 30. On the pixel definition film PDL, an opening OP may be defined. The opening OP of the pixel definition film PDL may expose at least a portion of the first electrode AE. The opening OP of the pixel definition film PDL is named as a light emitting opening to distinguish it from the other openings.

In an implementation, on the top surface of the pixel definition film PDL, a spacer overlapping a portion of the pixel definition film PDL may be disposed. The space may be an integral structure with the pixel definition film PDL, or may be an insulating structure formed by an additional process.

As shown in FIG. 5A, the display panel DP may include a light emitting area PXA, and a non-light emitting area NPXA adjacent to the light emitting area PXA. The non-light emitting area NPXA may surround the light emitting area PXA. In an implementation, the light emitting area PXA is defined to correspond to some regions of the first electrode AE exposed by the opening OP.

A hole control layer HCL may be commonly disposed in the light emitting area PXA and the non-light emitting area NPXA. The hole control layer HCL may include a hole transport layer, and may further include a hole injection layer. On the hole control layer HCL, a light emitting layer EML may be disposed. The light emitting layer EML, may be in a region corresponding to the opening OP. For example, the light emitting layer EML may be divided and formed in each of the plurality of pixels PX. The light emitting layer EML may include an organic material and/or an inorganic material. The light emitting layer EML may generate a predetermined colored light.

On the light emitting layer EML, an electron control layer ECL may be disposed. The electron control layer ECL may include an electron transport layer, and may further include an electron injection layer. The hole control layer HCL and the electron control layer ECL may be commonly formed in the plurality of pixels PX using an open mask. On the electron control layer ECL, a second electrode CE may be disposed. The second electrode CE has an integral shape and is commonly disposed in the plurality of pixels PX.

As shown in FIG. 5A and FIG. 5B, on the second electrode CE, the upper layer TFL may be disposed. The upper layer TFL may include a plurality of thin films. In an implementation, the upper layer TFL may include a capping layer CPL and a thin film encapsulation layer TFE. The thin film encapsulation layer TFE may include a first inorganic layer IOL1, an organic layer OL, and a second inorganic layer IOL2.

The capping layer CPL may be on the second electrode CE and may contact the second electrode CE. The capping layer CPL may include an inorganic material. The capping layer CPL may be defined as a first organic layer of the upper layer TFL. The organic layer OL of the thin film encapsulation layer TFE may be defined as a second organic layer of the upper layer TFL.

The first inorganic layer IOL1 may be on the capping layer CPL and may contact the capping layer CPL. The organic layer OL may be on the first inorganic layer IOL1 and may contact the first inorganic layer IOL1. The second inorganic layer IOL2 may be on the organic layer OL and may contact the organic layer OL.

The capping layer CPL may help protect the second electrode CE from a subsequent process such as a sputtering process and improves the light emitting efficiency of the organic light emitting diode OLED. The capping layer CPL may have a higher refractive index than the first inorganic layer IOL1. The refractive index of the capping layer CPL may be, e.g., about 1.8 to about 1.9 with respect to a wavelength of about 633 nm.

A portion of light generated in the light emitting layer EML may be transmitted to the outside through the second electrode CE and the thin film sealing layer TFE and another portion is reflected due to the difference in refractive index between the capping layer CPL and the first inorganic layer IOL1. The reflected light may be reflected and amplified by the first electrode AE and the second electrode CE. The light emitting efficiency of the organic light emitting diode OLED may be improved by the resonance effect.

The thickness of the capping layer CPL may be from about 500 Å to about 900 Å. The organic material of the capping layer CPL may include poly (3,4-ethylenedioxythiophene) (PEDOT), 4,4'-bis [N-(3-methylphenyl)-N-phenylamino] biphenyl (TPD), 4,4',4"-tris [(3-methylphenyl)phenylamino] triphenylamine (m-MTDATA), 1,3,5-tris [N,N-bis(2-methylphenyl)-amino]-benzene (o-MTDAB), 1,3,5-tris [N,N-bis(3-methylphenyl)-amino]-benzene (m-MTDAB). 1,3,5-tris [N,N-bis(4-methylphenyl)-amino]-benzene (p-MTDAB), 4,4'-Bis [N,N-bis(3-methylphenyl)-amino]-diphenylmethane (BPPM), 4,4'-dicarbazolyl-1,1'-biphenyl (CBP), 4,4',4"-tris(N-carbazole)triphenylamine (TCTA), 2,2',2"-(1,3,5-benzenetolyl)tris-[1-phenyl-1H-benzoimidazole] (TPBI), or 3-(4-biphenyl)-4-phenyl-5-t-butylphenyl-1,2,4-triazole (TAZ).

In an implementation, the capping layer CPL may include an organic material having a refractive index of 0.2 to 0.5 higher than the first inorganic layer TOLL The first inorganic layer IOL1 and the second inorganic layer IOL2 may help protect the display element layer DP-OLED from moisture/oxygen, and the organic layer OL may help protect the display element layer DP-OLED from a foreign material such as a dust particle. The first inorganic layer IOL1 and the second inorganic layer IOL2 may be any of a silicon nitride layer, a silicon oxynitride layer, and a silicon oxide layer. In an implementation, the first inorganic layer IOL1 and the second inorganic layer IOL2 may include a titanium oxide layer, or an aluminum oxide layer, or the like.

In an implementation, the organic layer OL may include an acryl organic layer. The thickness of the organic layer OL may be about 3 μm to about 12 μm, and the refractive index thereof may be about 1.2 to 1.6 with respect to the wavelength of about 633 nm.

According to a comparative example, a LiF layer could be further disposed between the capping layer CPL and the first inorganic layer IOL1. The adhesion strength of the LiF layer to the capping layer CPL may be lower than that of a silicon nitride layer, a silicon oxynitride layer, and a silicon oxide layer, and there may be a problem in that the LiF layer may be peeled off from a layer on a lower side of the LiF layer. In an implementation, a LiF layer may be omitted so that defects caused by the upper insulating layer TFL may be reduced.

Figure 6A:
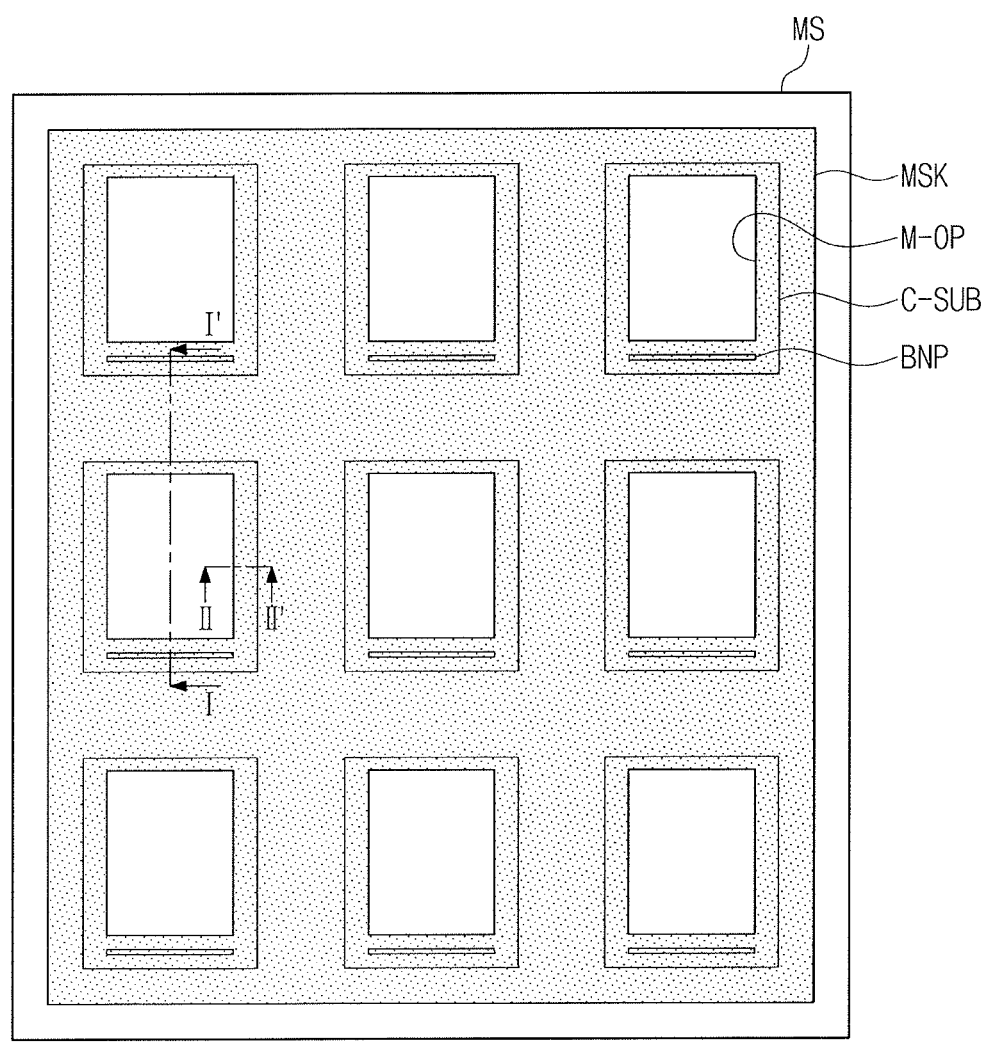
FIGS. 6A to 6C illustrate stages in a method of manufacturing a display apparatus according to an embodiment.
Figure 6B:
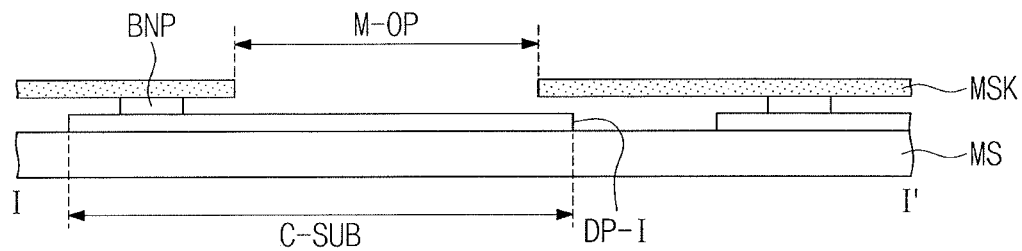
Figure 6C:
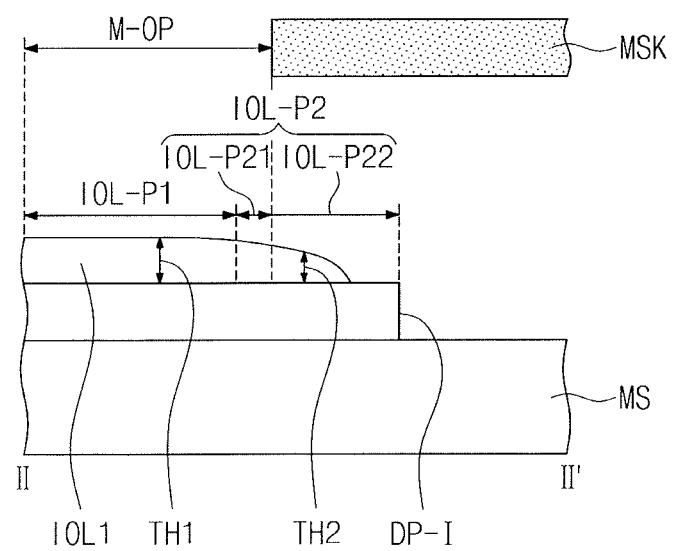
Figure 6D:
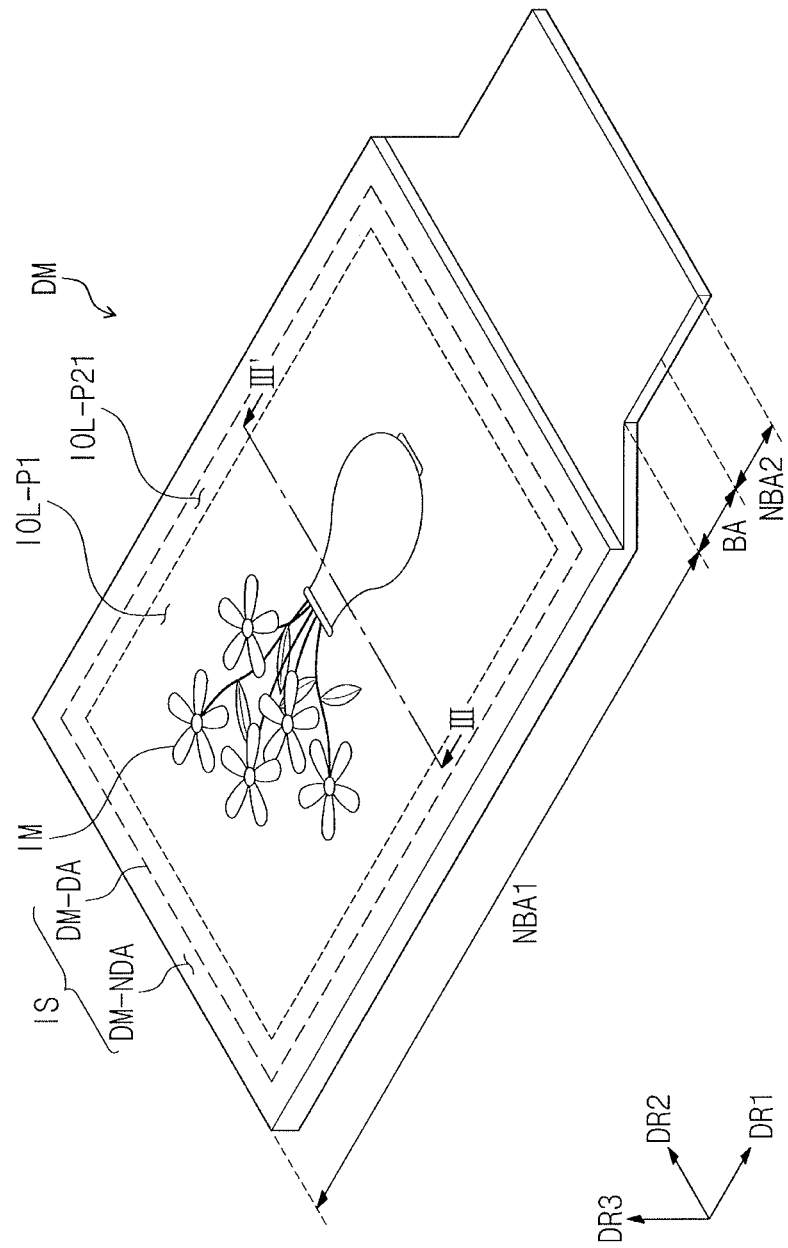
FIG. 6D illustrates a perspective view of a display apparatus according to an embodiment.
Figure 6E:
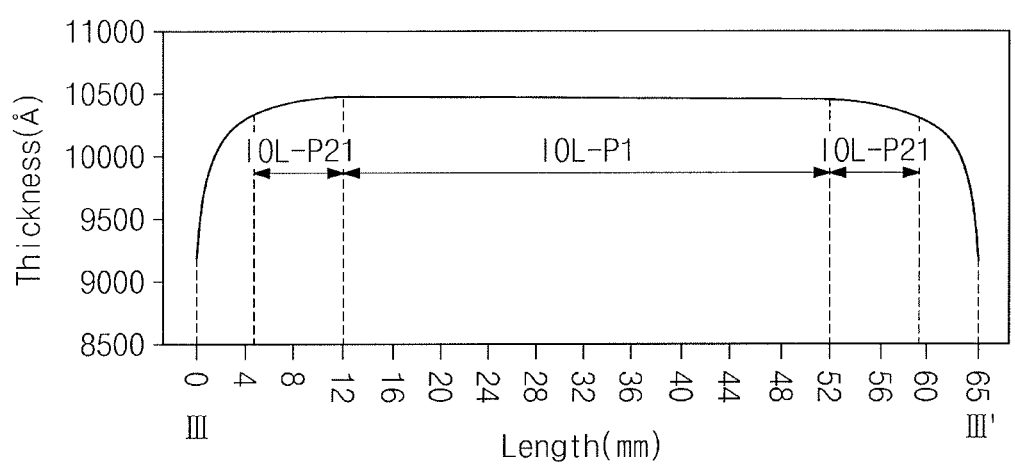
FIG. 6E illustrates a graph showing the thickness variation of a first inorganic layer according to an embodiment.

FIGS. 6A to 6C illustrate stages in a method of manufacturing the display apparatus DM according to an embodiment. FIG. 6D illustrates a perspective view of the display apparatus DM according to an embodiment. FIG. 6E illustrates a graph showing the thickness variation of the first inorganic layer IOL1 according to an embodiment. FIGS. 6A to 6C are views showing processes of forming the capping layer CPL and the thin film encapsulation layer TFE.

As shown in FIG. 6A, the same process may be performed on a plurality of cell areas C-SUB set on a mother substrate MS to form the display apparatus DM for each of the plurality of cell areas C-SUB. After the manufacturing process is completed, the mother substrate MS is cut to separate each of the display apparatus DM.

The capping layer CPL, the first inorganic layer IOL1, the organic layer OL, and the second inorganic layer IOL2 all shown in FIG. 5A and FIG. 5B may be sequentially formed. The layers may be formed through a deposition process to be described below. The deposition process will be described with respect to the first inorganic layer IOL1. In an implementation, the hole control layer HCL, the electron control layer ECL, and the second electrode CE all shown in FIG. 5A and FIG. 5B may all be formed using an open mask as well.

As shown in FIG. 6A and FIG. 6B, a mask MSK on which a plurality of openings M-OP are defined may be aligned to the mother substrate MS. The openings M-OP may correspond to the display area DP-DA shown in FIG. 3. The mother substrate MS to which the mask MSK is aligned may be placed in a deposition chamber and then an inorganic material is deposited.

A preliminary display panel DP-I shown in FIG. 6B and FIG. 6C refers to a state formed from the display element layer DP-OLED of the display panel DP shown in FIG. 5A. The mask MSK may be supported by the bank BNP. Since a gap is maintained between the mask MSK and the preliminary display panel DP-I, the inorganic material may be deposited in a larger area than the openings M-OP. Accordingly, the first inorganic layer IOL1 of the form shown in FIG. 6C may be formed.

As shown in FIG. 6C, the first inorganic layer IOL1 may include a first area IOL-P1 and a second area IOL-P2. The first area IOL-P1 may be an area occupying most of the first inorganic layer IOL1 and has a substantially uniform thickness. The thickness variation may be from about 0% to about 15%. The second area IOL-P2 may be defined as an area extending from the first area IOL-P1 and has a decreasing thickness with distance from the display area DP-DA.

A region IOL-P21 of the second area IOL-P2 may overlap the display area DP-DA, and the remaining other region IOL-P22 may overlap the non-display area DP-NDA. The second area IOL-P2 may be an area either adjacent to or overlapping the mask MSK, and the amount of inorganic material deposited is relatively small, thereby having a second thickness TH2 which is less than a first thickness TH1 of the first area IOL-P1. The second thickness TH2 of the second area IOL-P2 may decrease with an increase in distance from the first area IOL-P1.

FIG. 6D and FIG. 6E illustrate the thickness variation of the first inorganic layer IOU according to an embodiment. The thickness of the first area IOL-PI overlapping the display area DM-DA may be, e.g., about 8,500 Å to about 12,000 Å. In an implementation, the thickness of the first area IOL-PI overlapping the display area DM-DA may be, about 10,000 Å to about 11,000 Å. The thickness of the region IOL-P2I of the second area IOL-P2 which overlaps the display area DP-DA may be, e.g., about 9,500 Å to about 10,500 Å.

A display device DD may be designed such that the optical path of light emitted from the display panel DP is set based on the first area IOL-P1. The region IOL-P21 of the second area IOL-P2 may have a different optical path from the first area IOL-P1 so that white light may be shifted to red light. In an implementation, the first inorganic layer IOL1 may have a refractive index of about 1.60 to about 1.65 with respect to the wavelength of about 633 nm.

By having a refractive index of the above range, the color shift phenomenon caused by the upper layer TFL may be reduced. For example, when the first inorganic layer IOL1 has a low refractive index, the optical distance of light passing through the region IOL-P21 of the second area IOL-P2 may be reduced. The optical distance of light may be measured by multiplying the wavelength of light passing through a particular layer and the refractive index of the particular layer.

The capping layer CPL may have a smaller thickness than the first inorganic layer IOL1, and the color shift phenomenon caused by the capping layer CPL may be ignored. The capping layer CPL may have a thickness of, e.g., about 5% to about 10% of the thickness of the first area IOL-P1 of the first inorganic layer IOL1. Insulation layers on an upper side the first inorganic layer IOL1 may be away from the organic emitting diode OLED, and the color shift phenomenon caused by the insulation layers OL and IOL2 may not occur.

In an implementation, the inorganic layer IOL1 having the thickness variation shown in FIG. 6E may be a silicon oxynitride layer. The graph of FIG. 6E shows the thickness variation of the first inorganic layer IOL1 corresponding to III-UUU' of FIG. 6D.

The silicon oxynitride layer may have a refractive index of about 1.61 to about 1.63. The silicon oxynitride layer may be deposited in a mixed gas atmosphere of $H_2$, $N_2O$, $N_2$, $NH_3$, and $SiH_4$ at a chamber pressure of 1,200 mtorr and a power of 8,550 W. The atomic ratio of nitrogen to silicon in the silicon oxynitride layer may be from 0.43 to about 0.49, and the atomic ratio of oxygen to silicon may be from 0.62 to about 0.68. The film density of the silicon oxynitride layer may be 2.05 to 2.10 $g/cm^3$.

Figure 7A:
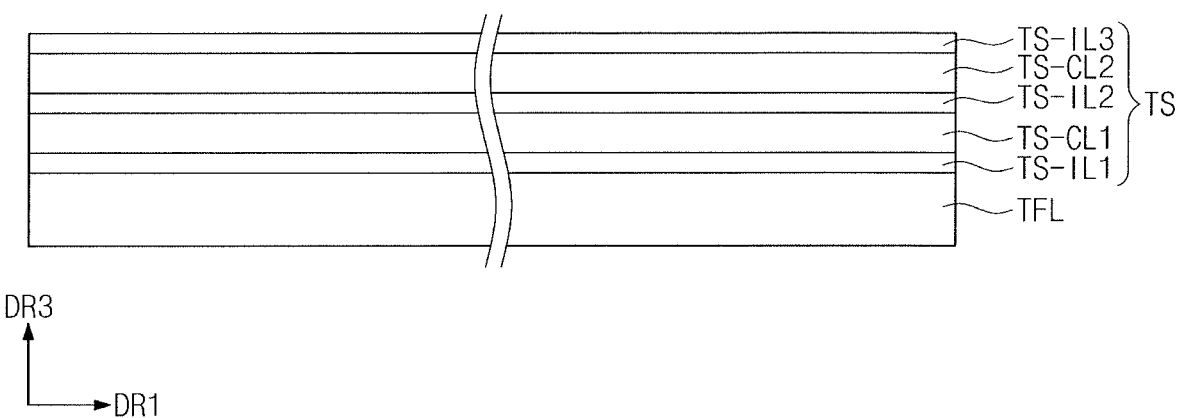
FIG. 7A illustrates a cross-sectional view of an input sensing unit according to an embodiment.
Figure 7B:
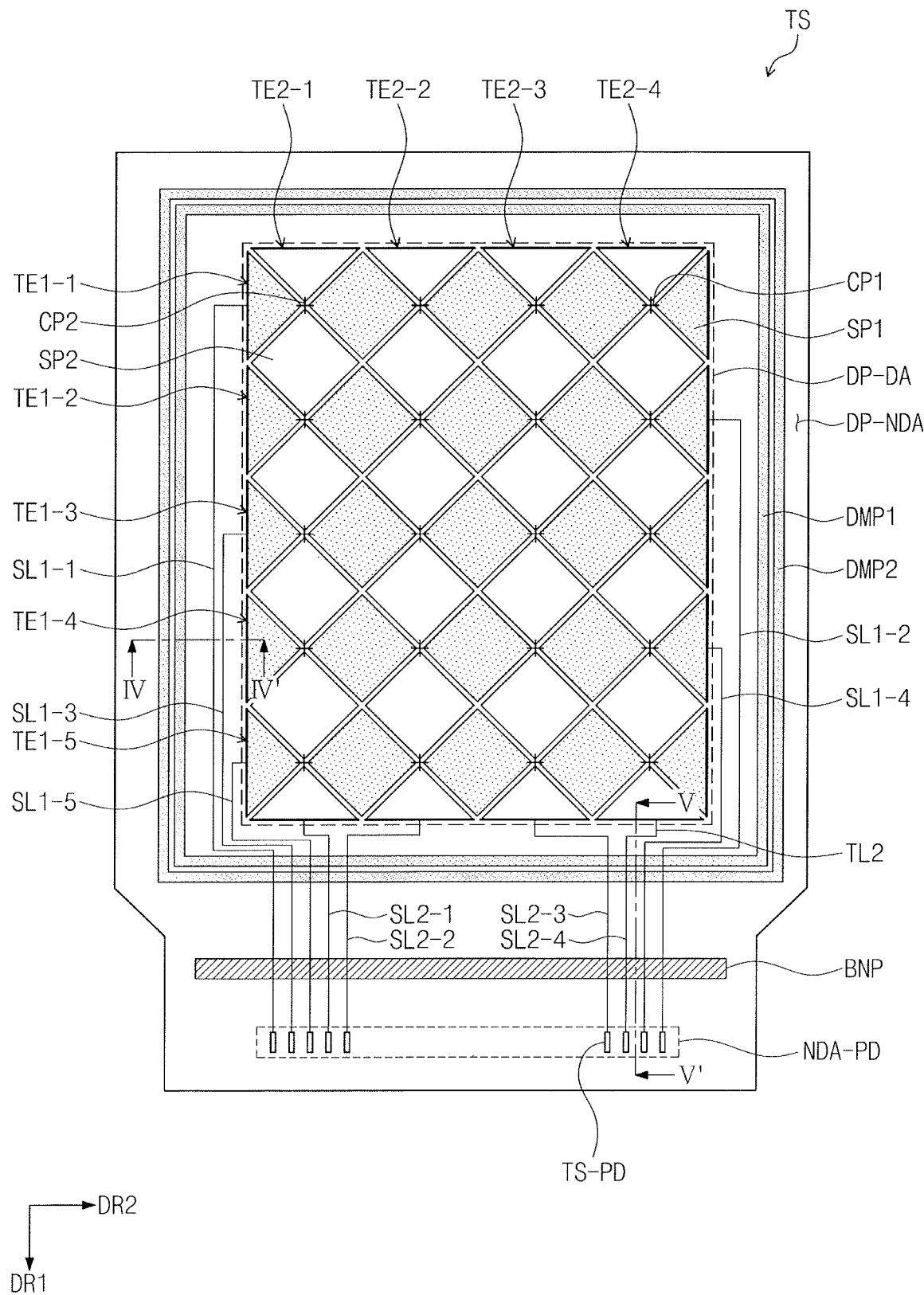
FIG. 7B illustrates a plan view of an input sensing unit according to an embodiment.

FIG. 7A illustrates a cross-sectional view of the input sensing unit TS according to an embodiment. FIG. 7B illustrates a plan view of an input sensing unit according to an embodiment.

As shown in FIG. 7A, the input sensing unit TS may include a first insulation layer TS-IL1 (hereinafter, a first touch insulation layer), a first conductive layer TS-CL1, a second insulation layer TS-IL2 (hereinafter, a second touch insulation layer), a second conductive layer TS-CL2, and a third insulation layer TS-IL3 (hereinafter, a third touch insulation layer). The first touch insulation layer TS-IL1 may be directly on the upper layer TFL. In an implementation, the first insulation layer TS-IL1 may be omitted.

The first conductive layer TS-CL1 and the second conductive layer IS-CL2 may each have a single-layered structure or a multi-layered structure laminated along the third direction axis DR3. The conductive layer of the multi-layered structure may include at least two of transparent conductive layers and metal layers. The conductive layer of the multi-layered structure may include metal layers each including different metals. The transparent conductive layer may include, e.g., indium tin oxide (ITO), indium zinc oxide (IZO), zinc oxide (ZnO), indium tin zinc oxide (ITZO), PEDOT, metal nanowires, or graphene. The metal layer may include, e.g., molybdenum, silver, titanium, copper, aluminum, or alloys thereof. For example, the first conductive layer TS-CL1 and the second conductive layer TS-CL2 may each have a three-layered structure of titanium/aluminum/titanium.

The first conductive layer TS-CL1 and the second conductive layer TS-CL2 may each include a plurality of conductive patterns. Hereinafter, the first conductive layer TS-CL1 is described as including first conductive patterns and the second conductive layer TS-CL2 is described as including second conductive patterns. The first conductive patterns and the second conductive patterns may each include touch electrodes and touch signal lines.

The first touch insulation layer TS-IL1 and the third touch insulation layer IL-IL3 may each include an inorganic material or an organic material. In an implementation, the first touch insulation layer TS-IL1 and the second touch insulation layer TS-IL2 may be an inorganic film including an inorganic material. The inorganic film may include, e.g., aluminum oxide, titanium oxide, silicon oxide silicon oxynitride, zirconium oxide, or hafnium oxide. The third touch insulation layer TS-IL3 may include an organic film. The organic film may include, e.g., an acryl resin(or acrylic-based resin), a methacryl resin, polyisoprene, a vinyl resin, an epoxy resin, a urethane resin, a cellulose resin, a siloxane resin, a polyimide resin, a polyamide resin, or a perylene resin.

As shown in FIG. 7B, the input sensing unit TS may include first touch electrodes TE1-1 to TE1-5, first touch signal lines SL1-1 to SL1-5 connected to the first touch electrodes TE1-1 to TE1-5, second touch electrodes TE2-1 to TE2-4, second touch signal lines SL2-1 to SL2-4 connected to the second touch electrodes TE2-1 to TE2-4, and touch pads TS-PD connected to the first touch signal lines SL1-1 to SL1-5 and the second touch signal lines SL2-1 to SL2-4. Referring to FIG. 7B, the first touch electrodes TE1-1 to TE1-5 and the second touch electrodes TE2-1 to TE2-4 may overlap the display area DP-DA. The first touch signal lines SL1-1 to SL1-5 may be connected to one end of the first touch electrodes TE1-1 to TE1-5. The second touch signal lines SL2-1 to SL2-4 may be connected to one end of the second touch electrodes TE2-1 to TE2-4.

In FIG. 7B, the insulation dam patterns DMP1 and DMP2 and the bank BNP all provided in the display panel DP are additionally shown in order to indicate the relative position thereof with respect to the input sensing unit TS.

The first touch electrodes TE1-1 to TE1 may each have a mesh shape in which a plurality of touch openings are defined. The first touch electrodes TE1-1 to TE1-5 may each include a plurality of first touch sensor units SP1 and a plurality of first connection units CP1. The first touch sensor units SP1 may be arranged along the second direction DR2. The first connection units CP1 may each connect two adjacent first touch sensor units SP1 among the first touch sensor units SP1. In an implementation, the first touch signal lines SL1-1 to SL1-5 may also have a mesh shape.

The second touch electrodes TE2-1 to TE2-4 may cross the first touch electrodes TE1-1 to TE1-5, and may be insulated from the first touch electrodes TE1-1 to TE1-5. The second touch electrodes TE2-1 to TE2-4 may each have a mesh shape in which a plurality of touch openings are defined. The second touch electrodes TE2-1 to TE2-4 may each include a plurality of second touch sensor units SP2 and a plurality of second connection units CP2. The second touch sensor units SP2 may be arranged along the first direction DR1. The second connection units CP2 may each connect two adjacent second touch sensor units SP2 among the second touch sensor units SP2. In an implementation, the second touch signal lines SL2-1 to SL2-4 may also have a mesh shape.

Some of the plurality of first touch sensor units SP1, the plurality of first connection units CP1, the first touch signal lines SL1-1 to SL1-5, the plurality of second touch sensor units SP2, the plurality of the second connection units CP2, and the second touch signal lines SL2-1 to SL2-4 may be formed by patterning the first conductive layer TS-CL1 shown in FIG. 7A, and other thereof may be formed by patterning the second conductive layer TS-CL2 shown in FIG. 7A. In an implementation, the plurality of first connection units CP1 may be formed from the first conductive layer TS-CL1, and the plurality of first touch sensor units SP1, the first touch signal lines SL1-1 to SL1-5, the plurality of second touch sensor units SP2, the plurality of the second connection units CP2, and the second touch signal lines SL2-1 to SL2-4 may be formed from the second conductive layer TS-CL2. The first connection portions CP1 may be connected to the plurality of first touch sensor units SP1 through contact holes passing through the second touch insulation layer TS-IL2.

In an implementation, the input sensing unit TS in which the plurality of first connection units CP1 and the plurality of second connection units CP2 may cross each other. In an implementation, the second connection units CP2 may each be transformed into a V-shape, a <-shape, or a >-shape so as not to overlap the plurality of first connection units CP1. The V-shaped second connection units CP2 may overlap the first touch sensor units SP1. In an implementation, the first touch sensor units SP1 and the second touch sensor units SP2 may have, e.g., a lozenge shape or a triangular shape.

In an implementation, the input sensing unit TS according to an embodiment may be a single-layered input sensing unit including one conductive layer. A single-layered touch sensing unit may obtain coordinate information in a self-cap manner.

Figure 8A:
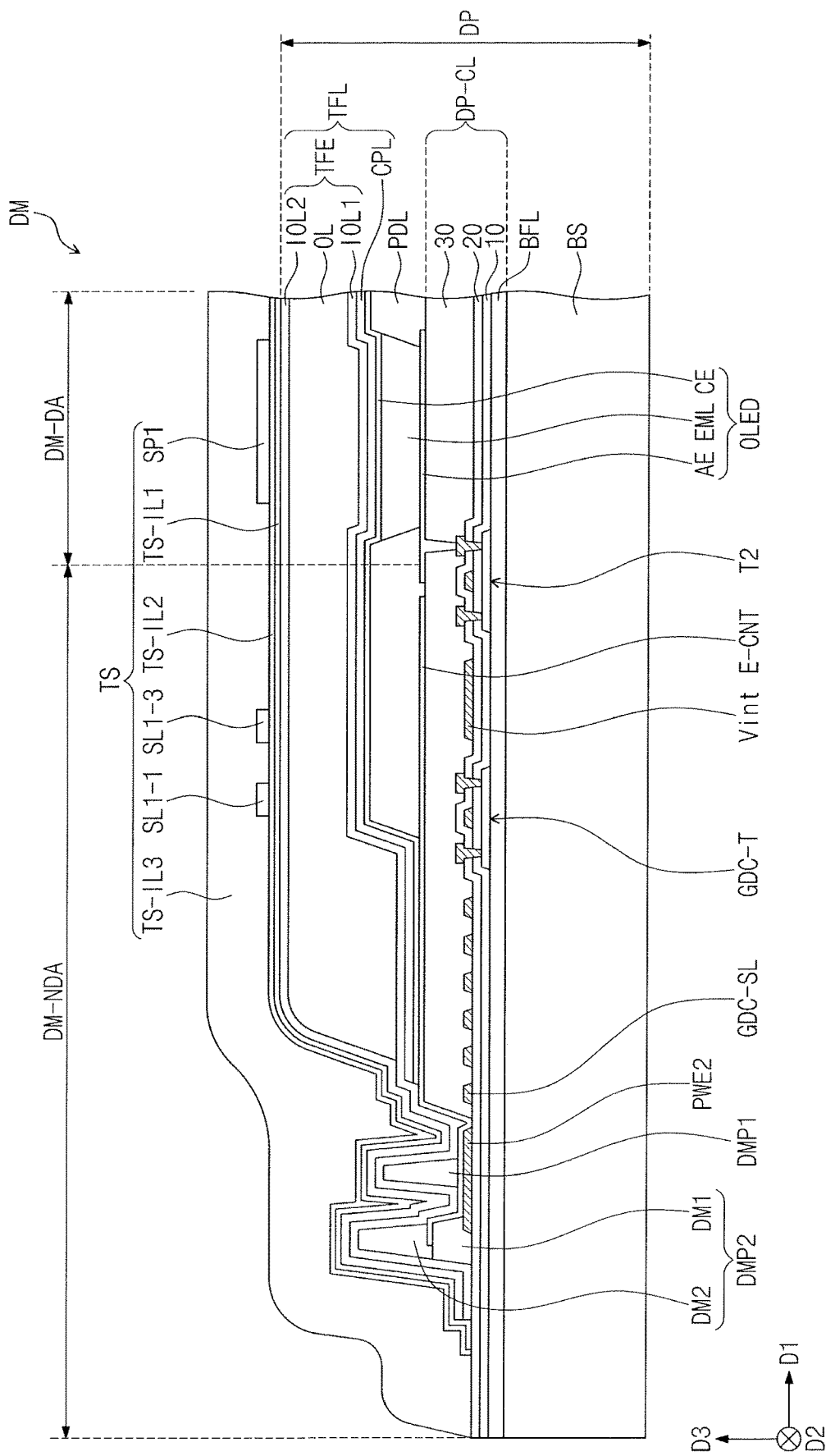
FIG. 8A illustrates a cross-sectional view of a display apparatus according to an embodiment.
Figure 8B:
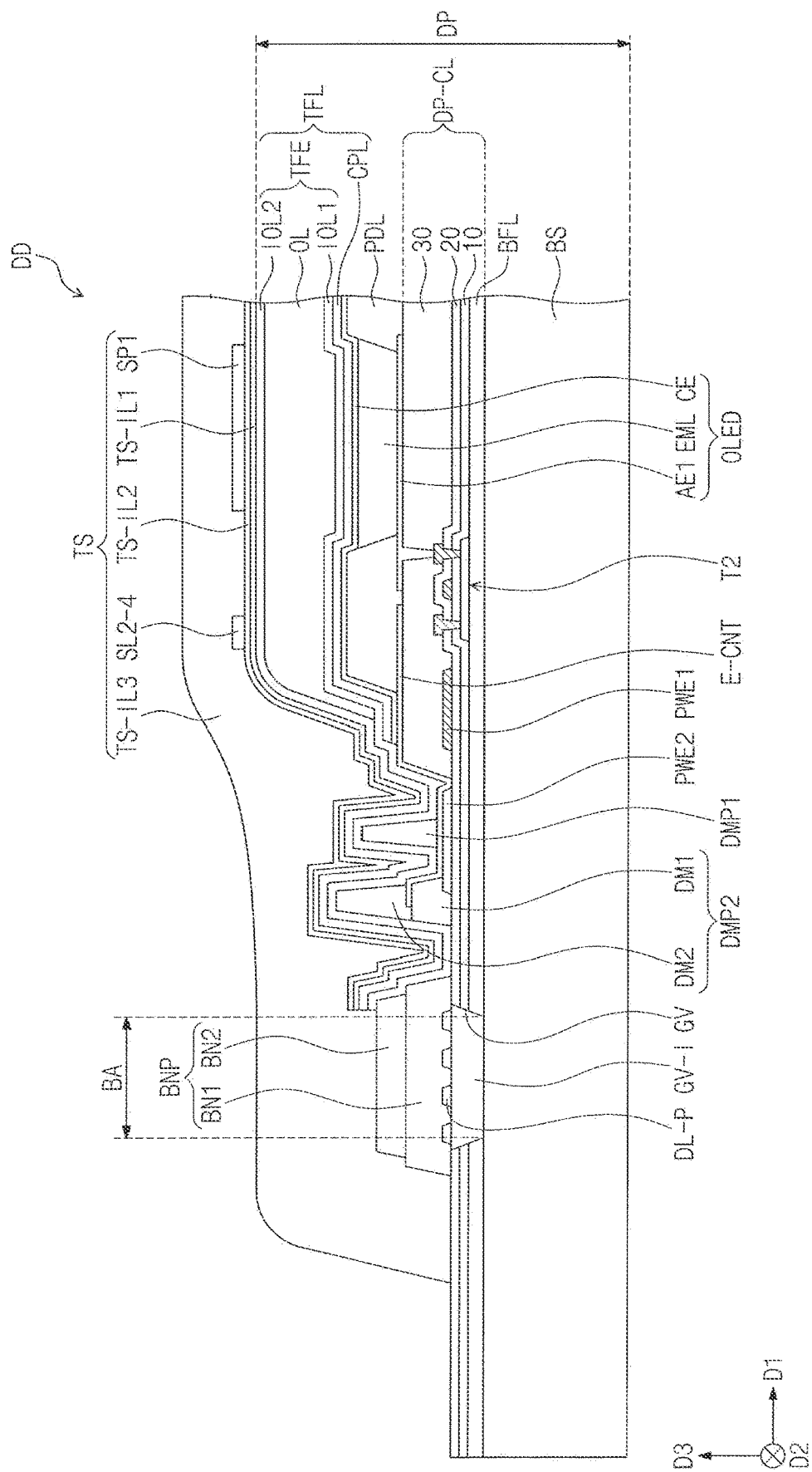
FIG. 8B illustrates a cross-sectional view of a display apparatus according to an embodiment.
Figure 9:
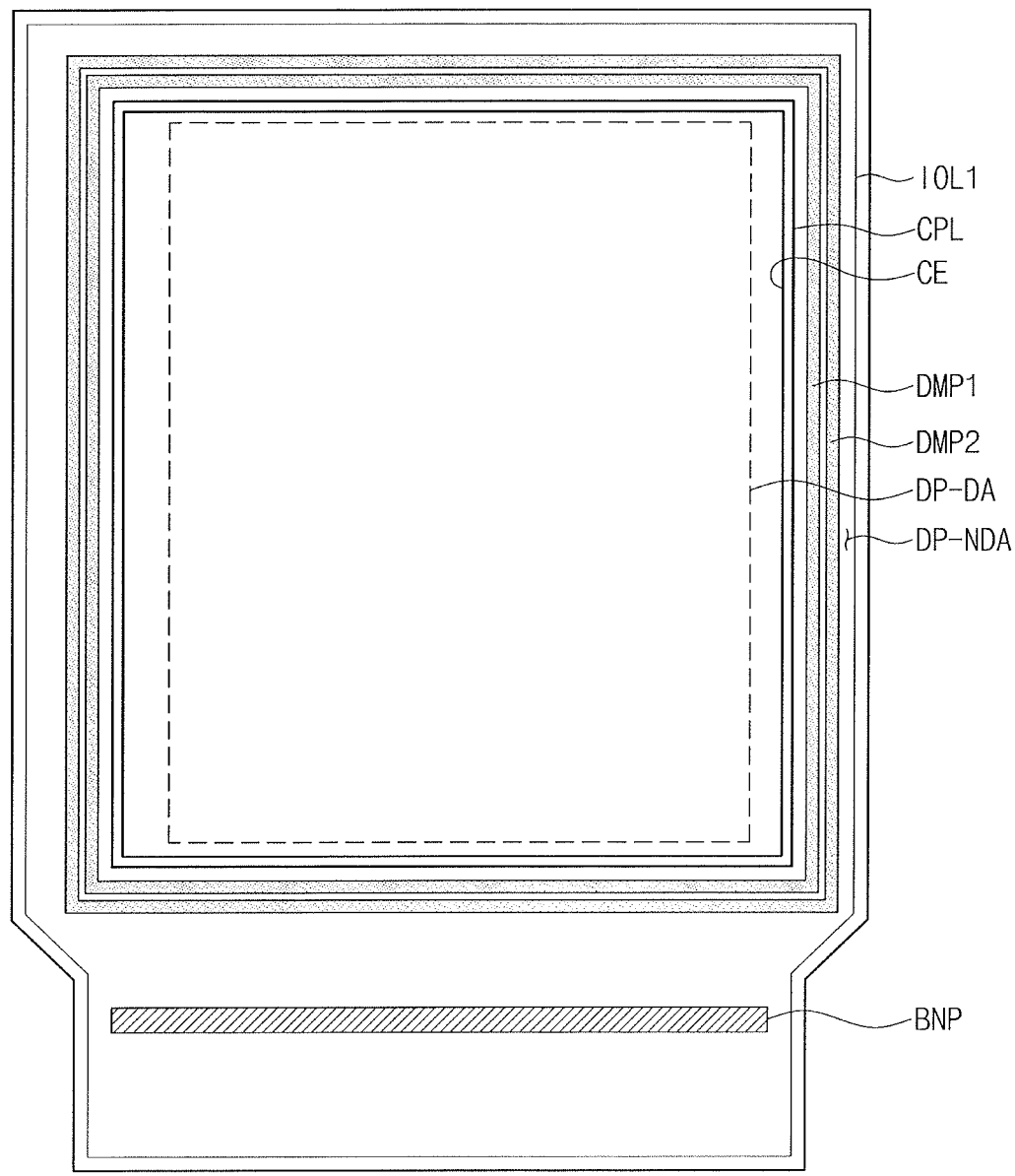
FIG. 9 illustrates a plan view of a display apparatus according to an embodiment.

FIG. 8A illustrates a cross-sectional view of the display apparatus DM according to an embodiment. FIG. 8B illustrates a cross-sectional view of the display apparatus DM according to an embodiment. FIG. 9 illustrates a plan view of the display apparatus DM according to an embodiment. FIG. 8A shows a cross section corresponding to IV-IV' of FIG. 7B, and FIG. 8B shows a cross section corresponding to V-V' of FIG. 7B.

The laminated structure of the circuit element layer DP-CL, the display element layer DP-OLED, and the upper insulating layer TFL in the display area DP-DA is the same as the structure described with reference to FIG. 5A, and therefore, a repeated detailed description thereof may be omitted. However, in FIG. 8A and FIG. 8B, the hole control layer HCL and the electron control layer ECL are not shown. The laminated structure of the input sensing unit TS is also the same as the structure described with reference to FIG. 7A and FIG. 7B, and therefore, a repeated detailed description thereof may be omitted.

As shown in FIG. 8A and FIG. 8B, the scan driving circuit GDC (see FIG. 3) constituting the circuit element layer DP-CL may be in the non-display area DP-NDA. The scan driving circuit GDC may include at least one transistor GDC-T formed through the same process as a pixel transistor, e.g. a driving transistor T2. The scan driving circuit GDC may include signal lines GDC-SL on the same layer as an input electrode of the driving transistor T2. In an implementation, the scan driving circuit GDC may further include signal lines on the same layer as a control electrode of the driving transistor T2.

A signal line Vint for providing an initialization voltage to a pixel circuit may be on the same layer as the input electrode of the driving transistor T2. A second power electrode PWE2 for providing the second power voltage ELVSS (see FIG. 4) may be outside the scan driving circuit GDC. The second power electrode PWE2 may receive the second power voltage ELVSS from the outside. On the intermediate organic film 30, a connection electrode E-CNT may be disposed. The connection electrode E-CNT may connect the second power electrode PWE2 and the second electrode CE. The connection electrode E-CNT may be formed through the same process as the first electrode AE, and thus may have the same layer structure and the same material.

As shown in FIG. 8A and FIG. 8B, a first insulation dam pattern DMP1 and a second insulation dam pattern DMP2 may overlap the second power electrode PWE2. The first insulation dam pattern DMP1 may have a single-layered structure, and the second insulation dam pattern DMP2 may have a multi-layered structure. The first insulation dam pattern DMP1 and the pixel definition film PDL may be simultaneously formed. The first insulation dam pattern DMP1 may have a larger thickness than the pixel definition film PDL. A lower portion DM1 of the second insulation dam pattern DMP2 and the intermediate organic film 30 may be simultaneously formed, and an upper portion DM2 thereof and the pixel definition film PDL may be simultaneously formed.

As shown in FIG. 8B, a first power electrode PWE1 may be inside the second power electrode PWE2. The first power electrode PWE1 may receive the first power voltage ELVDD (see FIG. 5). The bank BNP may be outside of the first insulation dam pattern DMP1 and the second insulation dam pattern DMP2.

The bank BNP may have a multi-layered structure. A lower portion BN1 and the intermediate organic film 30 may be simultaneously formed, and an upper portion BN2 and the pixel definition film PDL may be simultaneously formed A groove GV may be defined in a region overlapping the bank BNP of the circuit element layer DP-CL. The groove GV may be formed by partially removing the buffer film BFL, the first intermediate inorganic film 10, and the second intermediate inorganic film 20. The groove GV may be formed so as to overlap the bending area BA described with reference to FIG. 1A and FIG. 1B.

An organic insulation material may be filled inside the groove GV. Such organic filling pattern GV-I may help improve the flexibility of the bending area BA. A signal line pattern DL-P may be on the organic filling pattern GV-I. The signal line pattern DL-P may be a portion of the data line DL described with reference to FIG. 3.

Referring to FIG. 8A to FIG. 9, an edge of the second electrode CE and an edge of the capping layer CPL may be aligned (e.g., substantially aligned) in a plan view. The second electrode CE and the capping layer CPL may be formed by a deposition process using the same open mask. As the capping layer CPL is substantially aligned to the second electrode CE, the peeling of the capping layer CPL may be prevented. For example, the capping layer CPL may have a greater adhesion strength to the second electrode CE than an insulation layer such as the intermediate organic film 30.

The deposition properties of constituent materials of the second electrode CE and constituent materials of the capping layer CPL may be different and errors may occur during the process, and the edge of the second electrode CE and the edge of the capping layer CPL edge may not be exactly the same even if the same open mask is used. Here, when "the edge of the second electrode CE and the edge of the capping layer CPL edge are aligned" means that the shortest distance between the edge of the second electrode CE and the edge of the capping layer CPL is 200 μm or less.

FIGS. 10A to 10D illustrate enlarged cross-sectional views of the upper layer TFL according to an embodiment. Repeated detailed description of the same configuration as the configuration described with reference to FIG. 1 to FIG. 9 may be omitted. The upper layer TFL described hereinafter may replace the upper layer TFL shown in FIG. 8A to FIG. 9. The upper layer TFL described hereinafter is described in comparison with the upper layer TFL shown in FIG. 5B.

Figure 10A:
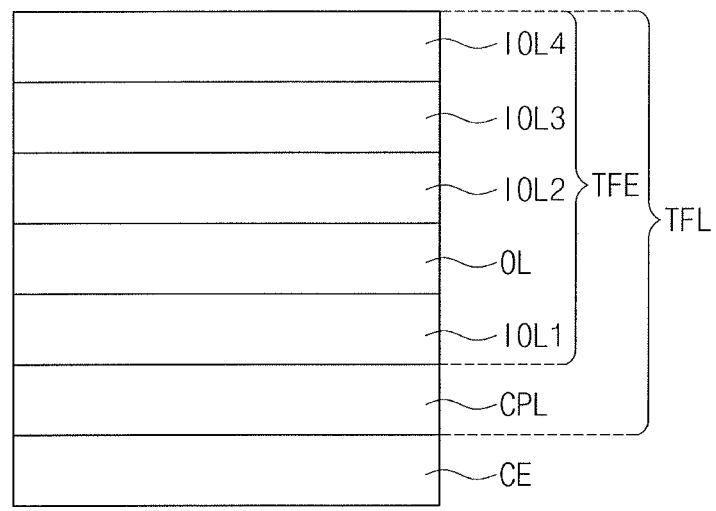
FIGS. 10A to 10D illustrate enlarged cross-sectional views of an upper layer according to an embodiment.

The second inorganic layer IOL2 shown in FIG. 10A may be the same as the second inorganic layer IOL2 shown in FIG. 5B. The second inorganic layer IOL2 may include silicon oxynitride. The second inorganic layer IOL2 may have a refractive index of about 1.7 to 2.0 with respect to the wavelength of about 633 nm, and may have a thickness of about 4,500 Å to about 8,000 Å.

As shown in FIG. 10A, the upper layer TFL may further include a third inorganic layer IOL3 and a fourth inorganic layer IOL4. The third inorganic layer IOL3 may include the same material and have the same refractive index as the first inorganic layer IOL1. The third inorganic layer IOL3 may have the same thickness as the first inorganic layer IOL1. The fourth inorganic layer IOL4 may include the same material and have the same refractive index as the second inorganic layer IOL2. The fourth inorganic layer IOL4 may have the same thickness as the second inorganic layer IOL2 shown in FIG. 5B.

Figure 10B:
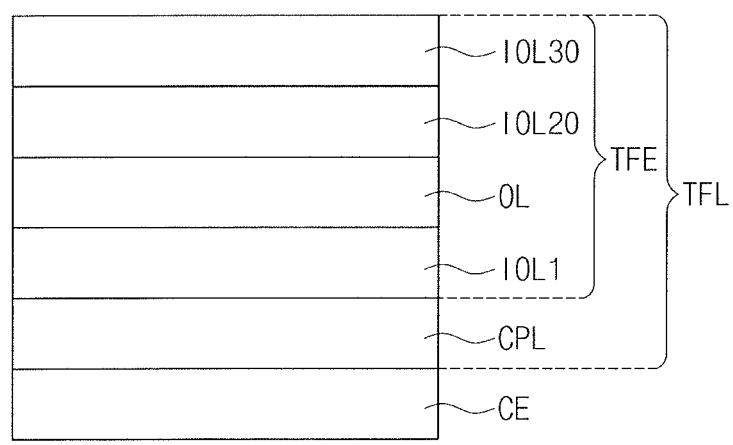

As shown in FIG. 10B, the upper layer TFL may further include a second inorganic layer IOL20 and a third inorganic layer IOL30. In an implementation, a second inorganic layer IOL20 may include the same material and may have the same refractive index as the first inorganic layer IOL1 shown in FIG. 5B. The second inorganic layer IOL20 may have the same thickness as the first inorganic layer IOL1. The third inorganic layer IOL30 may include the same material and have the same refractive index as the second inorganic layer IOL2 shown in FIG. 5B. The third inorganic layer IOL30 may have the same thickness as the second inorganic layer IOL2 shown in FIG. 5B.

Figure 10C:
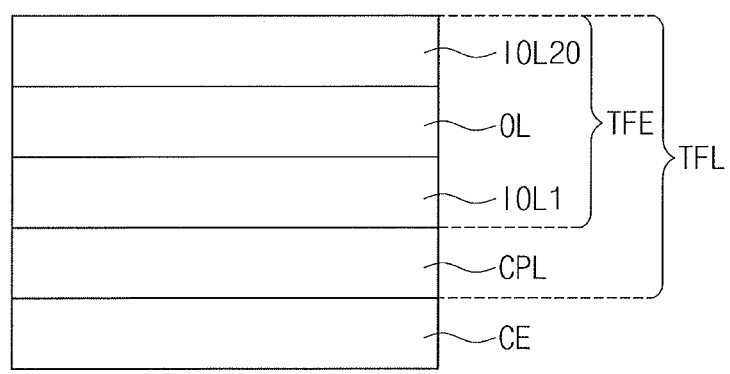

As shown in FIG. 10C, the upper layer TFL may include two inorganic layers IOL1 and IOL20. In an implementation, the second inorganic layer IOL20 may include the same material and may have the same refractive index as the first inorganic layer IOL1 shown in FIG. 5B. The second inorganic layer IOL20 may have the same thickness as the first inorganic layer IOL1.

Figure 10D:
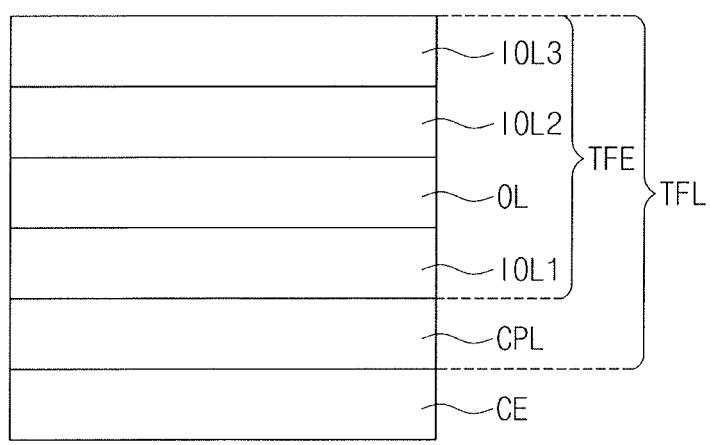

As shown in FIG. 10D, the upper layer TFL may further include the third inorganic layer IOL30. In an implementation, the third inorganic layer IOL30 may include the same material and have the same refractive index as the first inorganic layer IOL1 shown in FIG. 5B. The third inorganic layer IOL30 may have the same thickness as the first inorganic layer IOL1 shown in FIG. 5B.

According to the above, a first inorganic film may include silicon oxynitride, silicon oxide, and silicon nitride, and the adhesion strength thereof to a first organic film may be increased. The undesirable peeling phenomenon of an upper layer may be reduced.

The first inorganic film may have a refractive index described above, and the color shift phenomenon in a second area may be reduced.

The first organic film may be aligned to a second electrode, and the peeling of the first organic film may be prevented. For example, the adhesion strength to the second electrode may be greater than to another insulation layer.

One or more embodiments may provide a display apparatus including thin films.

One or more embodiments may provide a display apparatus with reduced defects.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display apparatus, comprising:
   a base layer including a display region and a non-display region outside of the display region;
   display elements on the display region, each of the display elements including a first electrode, a light emitting layer on the first electrode, and a second electrode on the light emitting layer; and
   an upper layer on the display elements and including:
   a first organic layer on the second electrode and directly contacting the second electrode in the display region;
   a first inorganic layer on the first organic layer and directly contacting the first organic layer in the display region;
   a second organic layer on the first inorganic layer and directly contacting the first inorganic layer;
   a second inorganic layer on the second organic layer and directly contacting the second organic layer in the display region; and
   a third inorganic layer on, and directly contacting, the second inorganic layer in the display region,
   wherein the first inorganic layer includes a first area and a second area extending from the first area, the first area having a refractive index of about 1.60 to about 1.65 with respect to a wavelength of about 633 nm,
   wherein the first area has a uniform thickness, and wherein a thickness of the second area decreases as a distance from the display region increases.

2. The display apparatus as claimed in claim 1, wherein the first organic layer has a higher refractive index than the first inorganic layer.

3. The display apparatus as claimed in claim 1, wherein the reflective index of the first organic layer is about 1.8 to about 1.9.

4. The display apparatus as claimed in claim 1, wherein the first inorganic layer includes silicon oxynitride.

5. The display apparatus as claimed in claim 1, wherein the first inorganic layer is one of silicon oxynitride layer, silicon oxide layer, and silicon nitride layer.

6. The display apparatus as claimed in claim 1, wherein a thickness of the first organic layer is about 5% to about 10% of the thickness of the first area of the first inorganic layer.

7. The display apparatus as claimed in claim 1, wherein:
a thickness of the first organic layer is about 500 Å to about 900 Å, and the thickness of the first area of the first inorganic layer is about 1,000 Å to about 11,000 Å.

8. The display apparatus as claimed in claim 1, wherein a thickness of a region, overlapping the display region, in the second area is about 9,500 Å to about 10,500 Å.

9. The display apparatus as claimed in claim 1, wherein:
the second organic layer includes an acryl monomer, and a thickness of the second organic layer is about 3 μm to about 12 μm.

10. The display apparatus as claimed in claim 1, wherein:
the second electrode of the display elements has an integral shape, and
an edge of the second electrode and an edge of the first organic layer are aligned in a plan view.

11. The display apparatus as claimed in claim 1, wherein the second inorganic layer includes silicon nitride.

12. The display apparatus as claimed in claim 11, wherein the second inorganic layer has:
a refractive index of about 1.7 to about 2.0, and
a thickness of about 4,500 Å to about 8,000 Å.

13. The display apparatus as claimed in claim 1, further comprising:
a first touch insulation layer on the second inorganic layer and contacting the second inorganic layer;
a first conductive pattern on the first touch insulation layer;
a second touch insulation layer on the first touch insulation layer and covering the first conductive pattern;
a second conductive pattern on the second touch insulation layer and electrically connected to the first conductive pattern; and
a third touch insulation layer on the second touch insulation layer and covering the second conductive pattern.

14. The display apparatus as claimed in claim 13, wherein:
the first touch insulation layer and the second touch insulation layer each include an inorganic material, and
the third touch insulation layer includes an organic material.

15. A display apparatus, comprising:
a base layer including a display region and a non-display region outside the display region;
display elements on the display region, each of the display elements including a first electrode, a light emitting layer on the first electrode, and a second electrode on the light emitting layer; and
an upper layer on the display elements and including:
an organic layer on the second electrode, the organic layer contacting the second electrode in the display region and having a refractive index of about 1.8 to about 1.9 with respect to a wavelength of about 633 nm;
a silicon oxynitride layer on the organic layer and contacting the organic layer in the display region;
a second inorganic layer on the silicon oxynitride layer; and
a third inorganic layer on, and directly contacting, the second inorganic layer and including a same material as the silicon oxynitride layer in the display region,
wherein the silicon oxynitride layer includes a first area and a second area extending from the first area, the first area having a refractive index of about 1.61 to about 1.63 with respect to the wavelength of about 633 nm, and
wherein the first area has a uniform thickness, and wherein a thickness of the second area decreases as a distance from the display region increases.

16. The display apparatus as claimed in claim 15, wherein:
the second electrode of each of the display elements has an integral shape,
an edge of the second electrode and an edge of the organic layer are aligned in a plan view, and
an edge of the silicon oxynitride layer is outside the edge of the second electrode and the edge of the organic layer.

* * * * *